(12) United States Patent
Muneishi

(10) Patent No.: US 10,971,430 B2
(45) Date of Patent: Apr. 6, 2021

(54) SEMICONDUCTOR DEVICE

(71) Applicant: KYOCERA CORPORATION, Kyoto (JP)

(72) Inventor: Takeshi Muneishi, Kyoto (JP)

(73) Assignee: KYOCERA Corporation, Kyoto (JP)

(*) Notice: Subject to any disclaimer, the term of this patent is extended or adjusted under 35 U.S.C. 154(b) by 0 days.

(21) Appl. No.: 16/093,188

(22) PCT Filed: Apr. 14, 2017

(86) PCT No.: PCT/JP2017/015404
§ 371 (c)(1),
(2) Date: Oct. 12, 2018

(87) PCT Pub. No.: WO2017/179736
PCT Pub. Date: Oct. 19, 2017

(65) Prior Publication Data
US 2019/0122956 A1 Apr. 25, 2019

(30) Foreign Application Priority Data

Apr. 15, 2016 (JP) .............................. JP2016-082526

(51) Int. Cl.
H01L 23/473 (2006.01)
H01L 23/373 (2006.01)
(Continued)

(52) U.S. Cl.
CPC ........ *H01L 23/473* (2013.01); *H01L 21/4882* (2013.01); *H01L 23/3731* (2013.01); *H01L 23/3735* (2013.01); *H01L 23/49562* (2013.01);
*H01L 23/49568* (2013.01); *H01L 24/73* (2013.01); *H01L 24/92* (2013.01); *H01L 25/07* (2013.01); *H01L 25/071* (2013.01); *H01L 25/18* (2013.01); *H01L 25/50* (2013.01);
(Continued)

(58) Field of Classification Search
CPC ................................................... H01L 23/3731
See application file for complete search history.

(56) References Cited

U.S. PATENT DOCUMENTS

2007/0215903 A1* 9/2007 Sakamoto ......... H01L 23/49844
257/192
2008/0128896 A1* 6/2008 Toh ....................... H01L 23/473
257/712

(Continued)

FOREIGN PATENT DOCUMENTS

JP S61230346 A 10/1986
JP 2008103623 A 5/2008
(Continued)

*Primary Examiner* — Omar F Mojaddedi
(74) *Attorney, Agent, or Firm* — Viering, Jentschura & Partnermbb

(57) ABSTRACT

A semiconductor device may include a cooling unit, the cooling unit including a circuit unit, a first flow path member comprised of an insulating material, and a second flow path member comprised of an insulating material. The circuit unit may include a heat sink layer, a wiring layer, and a semiconductor element that is disposed between the heat sink layer and the wiring layer. The circuit unit is disposed between the first flow path member and the second flow path member. The wiring layer may face the first flow path member or the second flow path member.

14 Claims, 6 Drawing Sheets

(51) Int. Cl.
  *H01L 23/495* (2006.01)
  *H01L 23/36* (2006.01)
  *H01L 25/07* (2006.01)
  *H01L 25/18* (2006.01)
  *H01L 23/31* (2006.01)
  *H01L 23/34* (2006.01)
  *H05K 7/20* (2006.01)
  *H01L 21/48* (2006.01)
  *H01L 25/00* (2006.01)
  *H01L 23/00* (2006.01)

(52) U.S. Cl.
  CPC ...... *H05K 7/20* (2013.01); *H01L 2224/73253* (2013.01); *H01L 2224/92225* (2013.01)

(56) References Cited

U.S. PATENT DOCUMENTS

| | | | | |
|---|---|---|---|---|
| 2008/0224303 | A1* | 9/2008 | Funakoshi | H01L 23/473 257/701 |
| 2016/0190032 | A1* | 6/2016 | Kodani | H01L 23/3731 257/668 |

FOREIGN PATENT DOCUMENTS

| | | | | |
|---|---|---|---|---|
| JP | 2010097967 | A | | 4/2010 |
| JP | 2011200088 | A * | 10/2011 | ..... H01L 2924/0002 |
| JP | 2011200088 | A | | 10/2011 |
| JP | 2013123014 | A | | 6/2013 |

* cited by examiner

SEMICONDUCTOR DEVICE

CROSS-REFERENCE TO RELATED APPLICATIONS

This application is a national stage entry according to 35 U.S.C. 371 of PCT Application No. PCT/JP2017/015404 filed on Apr. 14, 2017, which claims priority to Japanese Application No. 2016-082526 filed on Apr. 15, 2016, which are entirely incorporated herein by reference.

TECHNICAL FIELD

The present disclosure relates to a semiconductor device.

BACKGROUND

A semiconductor device for high power is widely used as a power conversion device for railway vehicles, etc. Examples of such a semiconductor device include an inverter using semiconductor elements such as an IGBT (Insulated Gate Bipolar Transistor) and an FWD (Free Wheeling Diode). In the case of a semiconductor device for high power, heating value due to switching loss or conduction loss becomes enormous, and thus it is necessary to take measures for cooling.

For example, in the semiconductor device disclosed in Japanese Unexamined Patent Publication JP-A 2008-103623 (Patent Literature 1), a semiconductor element is sandwiched between two lead frames, and a ceramic tube having a coolant flow path for flowing a coolant is provided on the outside of each lead frame. The semiconductor element and a signal line are connected by wire bonding.

SUMMARY

A semiconductor device may include a cooling unit, the cooling unit including a circuit unit, a first flow path member comprised of an insulating material, and a second flow path member comprised of an insulating material. The circuit unit may include a heat sink layer, a wiring layer, and a semiconductor element that is disposed between the heat sink layer and the wiring layer. The circuit unit is disposed between the first flow path member and the second flow path member. The wiring layer may face the first flow path member or the second flow path member.

BRIEF DESCRIPTION OF DRAWINGS

Other and further objects, features, and advantages of the invention will be more explicit from the following detailed description taken with reference to the drawings wherein.

DETAILED DESCRIPTION

In a semiconductor device, when heat exchange is performed between a coolant flowing through a ceramic tube and a semiconductor element via a lead frame, it is possible to cool the semiconductor element. However, wire bonding, which is the wiring for exchanging signals, is not in contact with the ceramic tube, and thus the cooling of the wire bonding is insufficient. Since the wire bonding carries heat, there is a possibility of occurrence of a problem that the semiconductor element does not function properly.

A semiconductor device of the present disclosure can efficiently cool the semiconductor element, and can also efficiently remove heat of the wiring layer for exchanging signals.

The semiconductor devices of the present disclosure will be described below with reference to the drawings. However, only constituent members necessary for explaining the features of the semiconductor devices of the present disclosure are shown in each of the following drawings for reference. Therefore, the semiconductor devices of the present disclosure may further include well-known constituent members not shown in each drawing.

Figure 1:
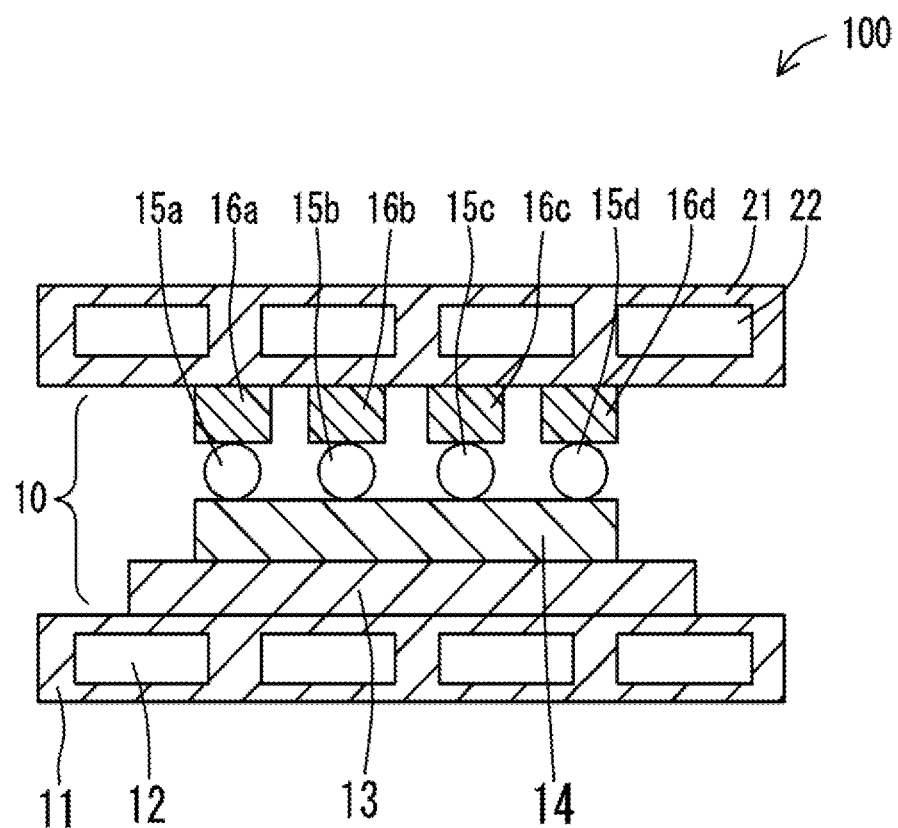
FIG. 1 is a cross-sectional view schematically showing a first non-limiting embodiment of a semiconductor device of the present disclosure.

FIG. 1 is a cross-sectional view schematically showing a first non-limiting embodiment of a semiconductor device of the present disclosure.

In a semiconductor device 100 shown in FIG. 1, a circuit unit 10 including a heat sink layer 13, wiring layers 16a to 16d, and a semiconductor element 14 disposed between the heat sink layer 13 and the wiring layers 16a to 16d is sandwiched between a first flow path member 11 and a second flow path member 21.

The first flow path member 11 and the second flow path member 21 include coolant flow paths 12 and 22, respectively, for flowing a cooling medium (hereinafter also referred to as "coolant") inside. Any coolable liquid and gas may be used as the coolant. For example, as a liquid coolant, pure water, Galden™ and the like may be used, and an anti-rust agent may be added. In this way, by flowing a coolant through the coolant flow paths 12 and 22, the circuit unit 10 can be cooled from both sides thereof. In the circuit unit 10, since the wiring layers 16a to 16d face the second flow path member 21, heat generated in the wiring layers 16a to 16d during signal exchange can be efficiently removed. Therefore, in the semiconductor device 100 of the present disclosure, deterioration of the function possessed by the semiconductor element 14 is little. Moreover, since the heat sink layer 13 faces the first flow path member 11, the semiconductor element 14 can be efficiently cooled via the wiring layers 16a to 16d and the heat sink layer 13.

In addition, the first flow path member 11 and the second flow path member 21 are formed of an insulating material, and thus it is possible to directly form the wiring layers 16a to 16d and the heat sink layer 13, and heat of the wiring layers 16a to 16d and the heat sink layer 13 can be delivered to the first flow path member 11 and the second flow path member 21 immediately.

For example, insulating material may be ceramics such as alumina ceramics, alumina-zirconia composite ceramics, aluminum nitride ceramics, and silicon nitride ceramics. In particular, since silicon nitride ceramics have both excellent thermal conductivity and mechanical strength, by forming the first flow path member 11 and the second flow path member 21 with silicon nitride ceramics, the semiconductor device 100 of the present disclosure can have both excellent cooling efficiency and mechanical strength.

For example, a silicon nitride ceramic may contain 70% by mass or more of silicon nitride out of 100% by mass of all components constituting the silicon nitride ceramic. The materials of the first flow path member 11 and the second flow path member 21 can be confirmed by the following method. First, measurement is performed using an X-ray diffraction apparatus (XRD), and the obtained value of 2θ (2θ is the diffraction angle) is identified with a JCPDS card. Next, quantitative analysis of each component is carried out using an ICP (Inductively Coupled Plasma) emission spectrophotometric analyzer (ICP) or an X-ray fluorescence analyzer (XRF). For example, in the XRD, when the presence of silicon nitride is confirmed and the content of silicon nitride ($Si_3N_4$) converted from the content of silicon (Si) measured by ICP or XRF is 70% by mass or more, the material is a silicon nitride ceramic. The same applies to other ceramics.

The first flow path member 11 and the second flow path member 21 may be formed with ceramics by various methods, including, for example, an extrusion method of preparing a metallic mold and extruding a green body, a lamination method of laminating and making green sheets, etc. In the lamination method, the structures of the coolant flow paths 12 and 22 can be freely designed.

Figure 2A:
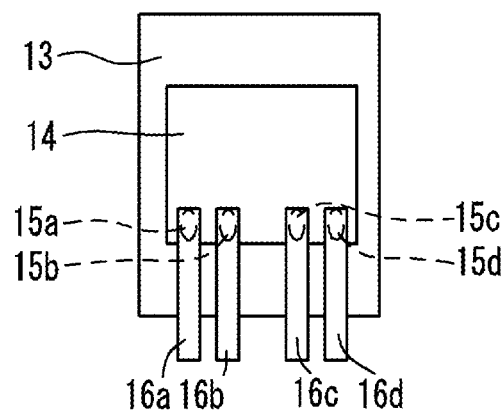
FIG. 2A is a schematic front view of a circuit unit of the first non-limiting embodiment of a semiconductor device of the present disclosure.

FIG. 2A is a schematic front view of a circuit unit of the first non-limiting embodiment of a semiconductor device of the present disclosure. FIG. 2A shows a view as seen towards the wiring layers 16a to 16d with the first flow path member 11 removed. Further, FIG. 2A shows a state in which the wiring layers 16a to 16d are connected to the semiconductor element (for example, IGBT) 14 via brazing materials or solders 15a to 15d in the four wiring layers 16a to 16d constituted in the same manner. In FIG. 2A, the brazing materials or solders 15a to 15d, which are hidden constituents, are indicated by broken lines.

Figure 2B:
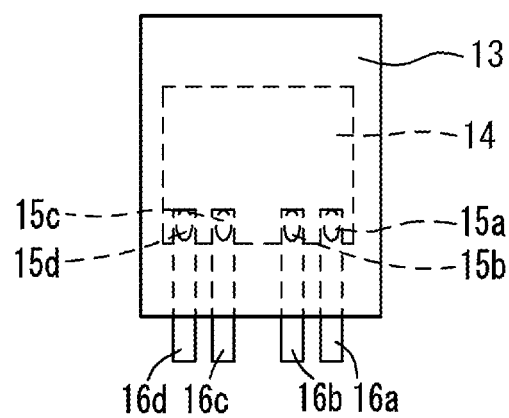
FIG. 2B is a schematic rear view of the circuit unit of the first non-limiting embodiment of a semiconductor device of the present disclosure.

In addition, FIG. 2B is a schematic rear view of the circuit unit of the first non-limiting embodiment of a semiconductor device of the present disclosure, and is a view corresponding to FIG. 2A. In FIG. 2B, the semiconductor element 14 and part of the wiring layers 16a to 16d, which are hidden and partially hidden, are indicated by broken lines.

Figure 2C:
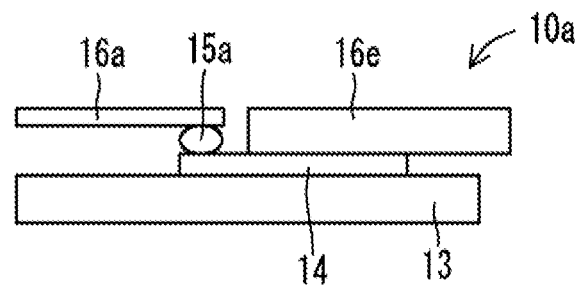
FIG. 2C is a schematic view of a modified example of the circuit unit of the first non-limiting embodiment of a semiconductor device of the present disclosure as seen from the side.

Further, FIG. 2C is a schematic view of a modified example of the circuit unit of the first non-limiting embodiment of a semiconductor device of the present disclosure as seen from the side. A modified example 10a of FIG. 2C shows a case where a collector of the semiconductor element 14 is on the heat sink layer 13 side, a gate of the semiconductor element 14 is on the wiring layer 16a side, an emitter of the semiconductor element 14 is on the wiring layer 16e side, the collector of the semiconductor element 14 is connected to the heat sink layer 13, the gate of the semiconductor element 14 is connected to the wiring layer 16a via the brazing material or the solder 15a, and the emitter of the semiconductor element 14 is connected to the wiring layer 16e. When the semiconductor element 14 is an IGBT, by providing another wiring layer on the second flow path member 21 and connecting the another wiring layer to the collector and the emitter of the semiconductor element 14, the semiconductor element 14 can function as an IGBT power module.

The wiring layers 16a to 16d included in the circuit unit 10 are wirings or terminals for establishing the connection with external devices, signal terminals, etc. The heat sink layer 13 included in the circuit unit 10 is a member for delivering heat of the semiconductor element 14 to the first flow path member 11. The heat sink layer 13 may also function as an electrode. The semiconductor element 14 is, for example, an IGBT (Insulated Gate Bipolar Transistor) or an FWD (Free Wheeling Diode), and may have another circuit element such as a capacitor and a resistor.

The wiring layers 16a to 16d and the heat sink layer 13 included in the circuit unit 10 may be formed of metal. When the wiring layers 16a to 16d and the heat sink layer 13 are formed of copper, copper alloy, aluminum, aluminum alloy or the like among metals, they have excellent thermal conductivity. As shown in FIG. 1, the wiring layers 16a to 16d may be connected to the semiconductor element 14 via brazing materials or solders 15a to 15d. Similarly, although not shown in the drawing, the heat sink layer 13 may be connected to the semiconductor element 14 via a brazing material, a solder, or a nano metal paste containing gold, silver, or copper as a main component. As the brazing materials or the solders 15a to 15d, a publicly known material may be used. For example, a silver-based brazing material or a tin-based solder may be used.

The wiring layers 16a to 16d and the heat sink layer 13 (hereinafter generally referred to as a metal layer in some cases) may be formed by various methods, including for example, a DBC (Direct Bond Copper) method or a DBA (Direct Bond Aluminum) method in which a metal plate such as a copper plate and an aluminum plate is directly adhered to the first flow path member 11 or the second flow path member 21, an AMB (Active Metal Bonding) method in which a metal plate is bonded via a silver and copper brazing material in which an active metal such as titanium, zirconium, hafnium, and niobium is added, a printing method of forming using a paste containing a metal component as a main component, a sputtering method of forming a metal layer by sputtering using titanium or chromium as an underlayer, a plating method of forming a metal layer using titanium or chromium as an underlayer, or after fine unevenness is formed, etc.

For example, in the case of using the plating method, thermal stress is not applied when a metal layer is formed on the first flow path member 11 and the second flow path member 21, and thus it is possible to obtain a semiconductor device 100 in which cracking is less prone to occur even in a long-term thermal cycle, and it is possible to enhance reliability.

Figure 3A:
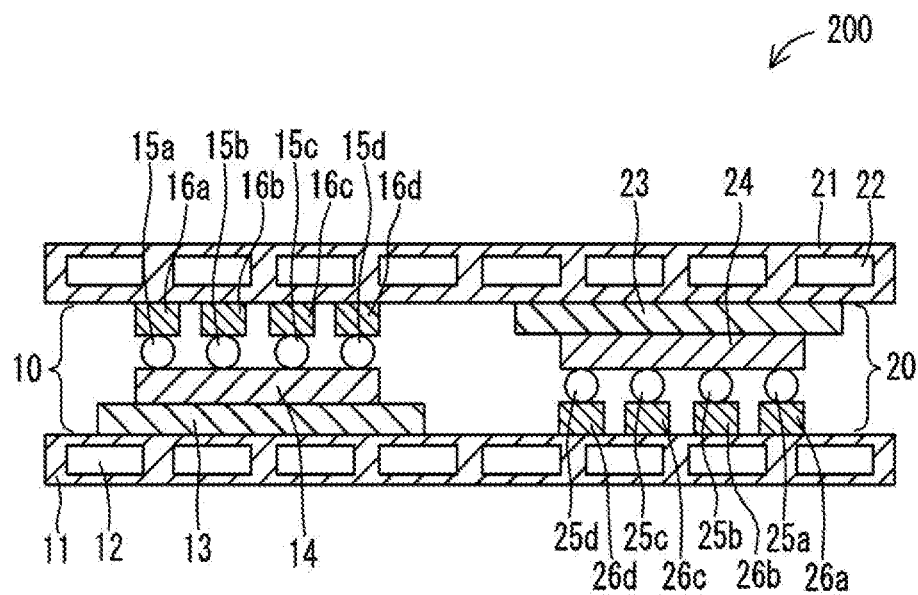
FIG. 3A is a cross-sectional view schematically showing a second non-limiting embodiment of a semiconductor device of the present disclosure.

FIG. 3A is a cross-sectional view schematically showing a second non-limiting embodiment of a semiconductor device of the present disclosure. For example, a circuit unit 20 of a semiconductor device 200 may be a circuit unit having the same laminated structure as the circuit unit 10, and similarly, wiring layers 26a to 26d face the first flow path member 11 and are efficiently cooled.

The circuit units 10 and 20 do not necessarily need to have the same laminated structure. For example, even when the elements or members forming each layer may be partially different in the circuit units 10 and 20, for example, the thicknesses of the heat sink layers 13 and 23 may be varied, so that the heat sink layers may be configured so as to mitigate the effects of the difference in thicknesses of the other elements or members of the circuit units and the like and the circuit units can be fitted between the first flow path member 11 and the second flow path member 21 without causing stress distortion.

For example, as shown in FIG. 3A, the circuit unit 10 and the circuit unit 20 are arranged adjacent to each other with the top and bottom of one being opposite to those of the other, that is, the laminating orders are opposite as "heat sink layer→semiconductor element→wiring layer" and "wiring layer→semiconductor element→heat sink layer". In other words, in the arrangement defined by a direction from the first flow path member 11 to the second flow path member 21 in FIG. 3A, the first circuit unit 10 comprises the heat sink layer 13, the semiconductor element 14, and the wiring layers 16*a* to 16*d* which are arranged in this order, and the second circuit unit 20 comprises the wiring layers 26*a* to 26*d*, the semiconductor element 24, and the heat sink layer 23 which are arranged in this order. Since the two circuit units 10 and 20 are positioned adjacent to each other in the semiconductor device 200, the wiring layers 16*a* to 16*d* and the wiring layers 26*a* to 26*d* can be efficiently cooled because they face the first flow path member 11 or the second flow path member 21. Furthermore, by arranging the adjacent circuit units 10 and 20 laminated oppositely, it is possible to balance heat and thermal stress.

Generally, since ceramics and metal have different thermal expansion coefficients, thermal stress is generated due to this difference. However, as shown in FIG. 3A, by laminating the adjacent circuit units 10 and 20 with the top and bottom reverse to each other, it is possible to avoid a situation in which the aforementioned thermal stresses are superimposed and to minimize the adverse effect thereof. The adjacent circuit units 10 and 20 are not limited to two but also may be three, and they may be arranged in front and rear. Moreover, a plurality of circuit units may be arranged in front, rear, left and right. In fabricating a semiconductor device 200 as shown in FIG. 3A, first, the heat sink layers 13 and 23 and the wiring layers 16*a* to 16*d*, 26*a* to 26*d* are respectively formed on the first flow path member 11 and the second flow path member 21. Then, after the semiconductor elements 14 and 24 are respectively bonded to the heat sink layers 13 and 23 via a brazing material, a solder, or a nano metal paste and the brazing material or the solders 15*a* to 15*d* and 25*a* to 25*d* are disposed to predetermined positions of the wiring layers 16*a* to 16*d* and 26*a* to 26*d*, the first flow path member 11 and the second flow path member 21 are laminated, and by passing through a solder reflow process, the semiconductor device 200 can be efficiently produced.

Figure 3B:
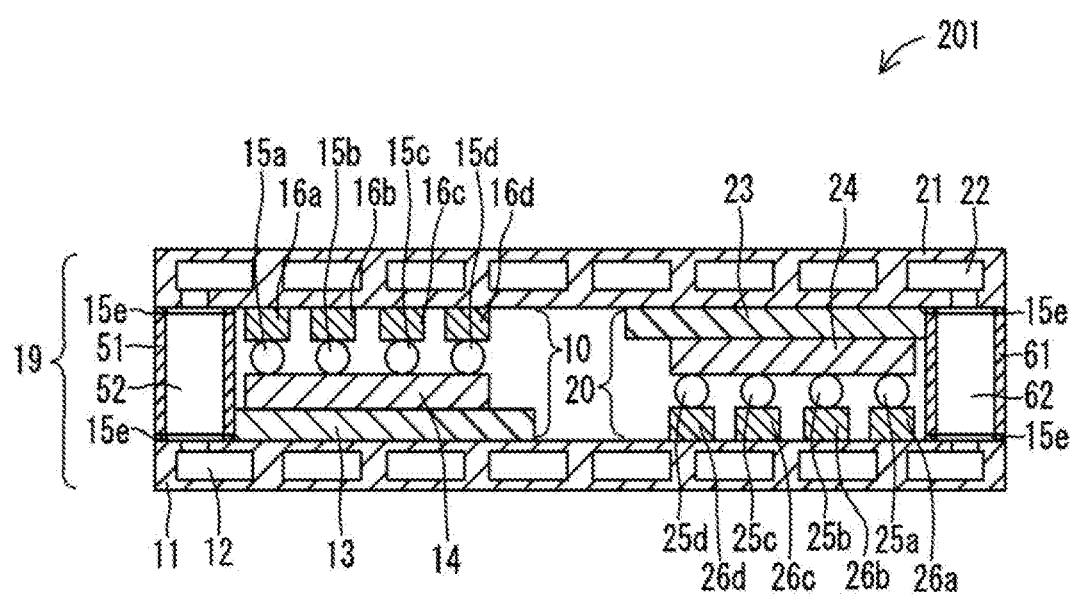
FIG. 3B is a cross-sectional view schematically showing a third non-limiting embodiment of a semiconductor device of the present disclosure.

FIG. 3B is a cross-sectional view schematically showing a third non-limiting embodiment of a semiconductor device of the present disclosure. A semiconductor device 201 of FIG. 3B may be the semiconductor device 200 of FIG. 3A that is additionally provided with connecting pipes 51 and 61. In order to join the connecting pipes 51 and 61 to the first flow path member 11 or the second flow path member 21, an adhesive layer 15*e* is provided between the respective opposing surfaces of the connecting pipes 51, 61 and the first flow path member 11 or the second flow path member 21. The adhesive layer 15*e* is formed by passing through a solder reflow process after applying an adhesive (for example, a silicon-based brazing material or a polyimide-based adhesive) between the connecting pipes 51, 61 and the first flow path member 11 or the second flow path member 21. In this way, the joining of the connecting pipes 51, 61 becomes possible simultaneously with soldering (or applying a brazing material) between the semiconductor elements 14, 24 and the wiring layers 16*a* to 16*d*, 26*a* to 26*d*.

For example, a semiconductor device 201 of the present disclosure may have an adhesive layer 15*e* between the respective opposing surfaces of the connecting pipes 51, 61 and the first flow path member 11 or the second flow path member 21. However, a part of the adhesive layer 15*e* may be positioned from the outer peripheral surfaces of the connecting pipes 51 and 61 to the first flow path member 11 or the second flow path member 21. The outer peripheral surfaces of the connecting pipes 51 and 61 are surfaces adjacent to the opposing surfaces. When such a structure is satisfied, a coolant flowing through the coolant flow paths 52 and 62 can be inhibited from leaking from between the connecting pipes 51, 61 and the first flow path member 11 or the second flow path member 21 by the adhesive layer 15*e*. In addition, when a part of the adhesive layer 15*e* is positioned from the inner surfaces of the coolant flow paths 52 and 62 of the connecting pipes 51 and 61 to the first flow path member 11 or the second flow path member 21, the coolant flowing through the coolant flow paths 52 and 62 can also be inhibited from leaking from between the connecting pipes 51, 61 and the first flow path member 11 or the second flow path member 21.

Figure 4:
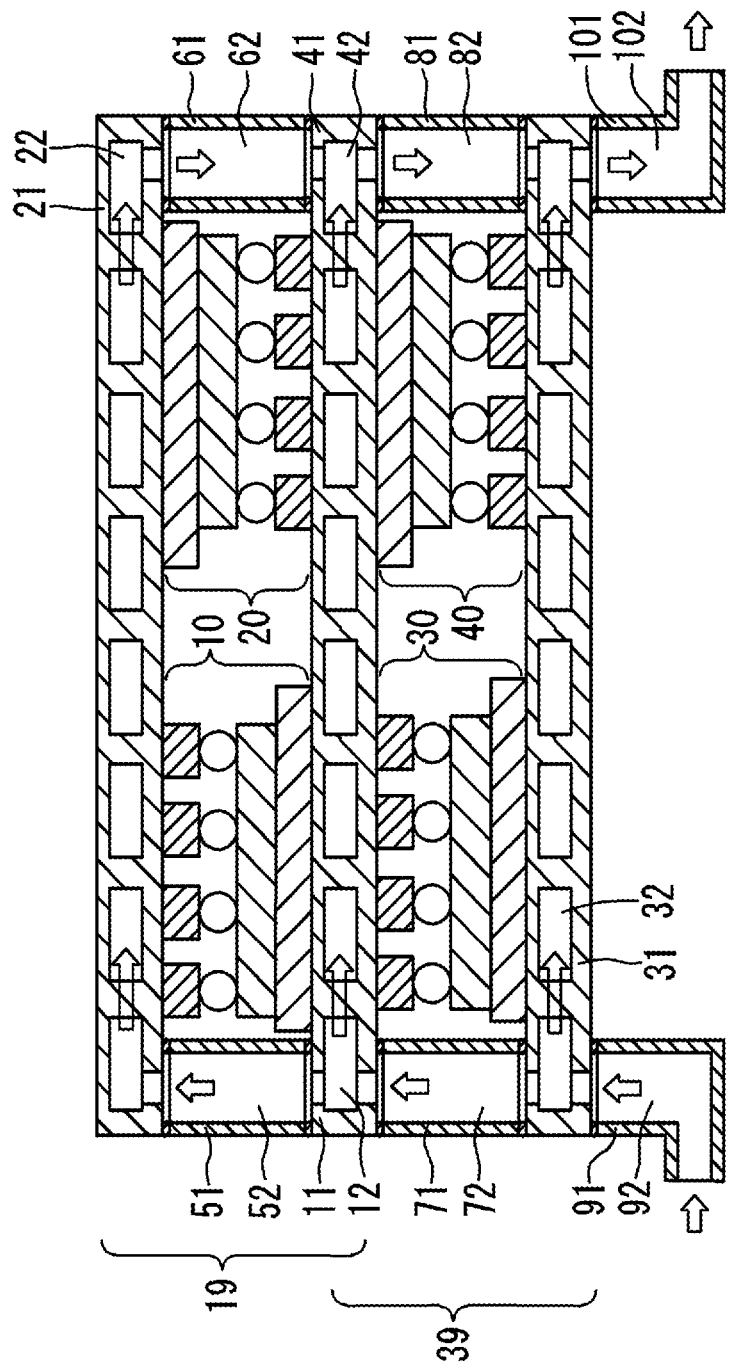
FIG. 4 is a cross-sectional view schematically showing a fourth non-limiting embodiment of a semiconductor device of the present disclosure.

FIG. 4 is a cross-sectional view schematically showing a fourth non-limiting embodiment of a semiconductor device of the present disclosure. A semiconductor device 300 as shown in FIG. 4 has a structure in which two semiconductor devices 201 of FIG. 3B are stacked vertically and further a pipe 91 for inflow of the coolant and a pipe 101 for outflow of the coolant are added, and the coolant circulates inside each coolant flow path. A cooling unit 19 may include a first flow path member 11, circuit units 10 and 20, and a second flow path member 21. Similarly, another cooling unit 39 may include a first flow path member 31, circuit units 30 and 40, and a second flow path member 41. As shown in FIG. 4, the first flow path member 11 and the second flow path member 41 are members shared by the cooling units 19 and 39. As shown in FIG. 4, the circuit units 10, 20, 30 and 40 may have the same laminated structures. However, they do not necessarily need to have the same laminated structures.

As another feature of the semiconductor device 300, by connecting the second flow path member 21 and the first flow path member 11 (also referred to as the second flow path member 41) and the first flow path member 31 with connecting pipes 51, 61, 71 and 81, a three-dimensional cooling unit can be formed and it is possible to balance heat and stress even in this case. Further, by disposing a brazing material paste or the like at a predetermined place and performing a heat treatment or the like, it is possible to constitute a stack type power module, and it is possible to realize a semiconductor device 300 with high cooling efficiency while having a high density circuit.

Figure 5:
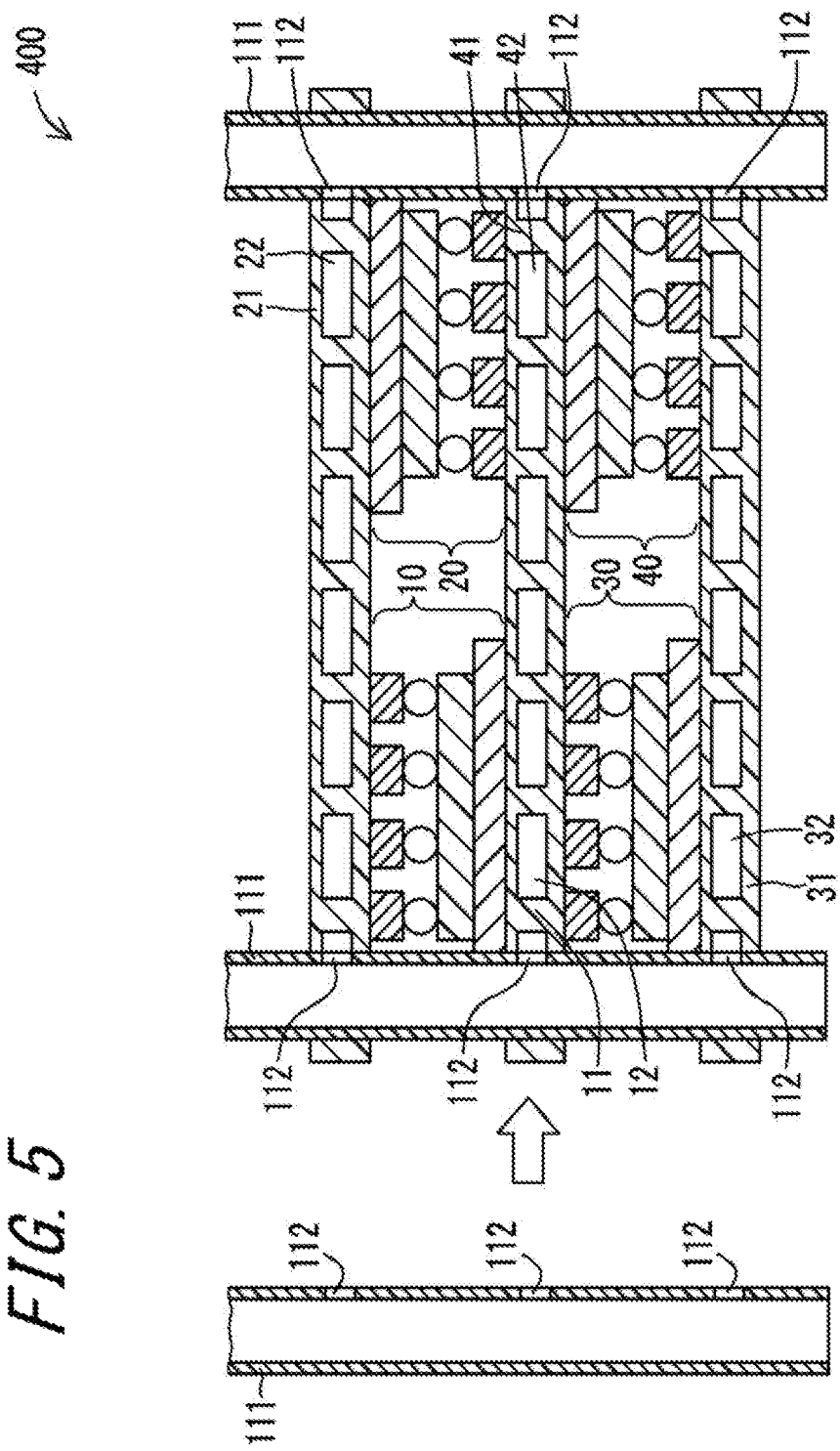
FIG. 5 is a cross-sectional view schematically showing a fifth non-limiting embodiment of a semiconductor device of the present disclosure.

FIG. 5 is a cross-sectional view schematically showing a fifth non-limiting embodiment of a semiconductor device of the present disclosure. A semiconductor device 400 as shown in FIG. 5 may include connecting pipes that are integrated. By preparing in advance a pipe 111 having a notch 112 and connecting it with the aforementioned cooling unit, it is possible to easily construct a stack type power module. In fabricating a semiconductor device 400 as shown in FIG. 5, it is possible to easily insert the pipe 111 positioned across a plurality of flow path members by preparing a ring-shaped spacer and arranging the spacer at a position corresponding to the notch 112 between a plurality of flow path members. Such a ring-shaped spacer also has an effect of preventing liquid leakage when the pipe 111 is broken.

Also in the semiconductor devices 300 and 400, similar to the semiconductor device 201, in order to join the connecting pipes 51, 61, 71, 81, the pipes 91, 101, 111, and the ring-shaped spacer, an adhesive (for example, a silicon-based brazing material or a polyimide-based adhesive) may be applied in advance, and by passing through a solder reflow process, the joining of the connecting pipes 51, 61, 71, 81, the pipes 91, 101, 111, and the ring-shaped spacer becomes possible simultaneously with soldering between the semiconductor elements and the wiring layers. The connecting pipes 51, 61, 71, 81, the pipes 91, 101, 111, and the ring-shaped spacer are preferably materials that can withstand the solder reflow process, for example, metal, resin, and ceramics. As the resin, polyimide is preferable. By sealing the circuit units 10, 20, 30 and 40 with a resin mold, the reliability of the semiconductor devices 300 and 400 can be enhanced. A silicone gel or an epoxy resin may be used as the resin mold. In the resin mold, by resin-molding not only the circuit units 10, 20, 30 and 40 but also the connecting pipes 51, 61, 71, 81, the pipes 91, 101, 111, and the ring-shaped spacer, it is possible to reinforce the joint portions between the connecting pipes 51, 61, 71, 81, the pipes 91, 101, 111, the ring-shaped spacer and the first flow path members 11, 31, the second flow path members 21 and 41.

The present disclosure may be embodied in other specific forms without departing from the spirit or essential characteristics thereof. The present embodiments are therefore to be considered in all respects as illustrative and not restrictive. Additional advantages and modifications will readily occur to those skilled in the art. Therefore, the invention in its broader aspects is not limited to the specific details and representative embodiments shown and described herein. One skilled in the art would recognize that various features in the disclosure are not necessarily mutually exclusive, as some aspects of the disclosure may be combined with one or more other embodiments and aspects of the disclosure. Accordingly, various modifications may be made without departing from the spirit or scope of the general inventive concept as defined by the appended claims and their equivalents.

REFERENCE SIGNS LIST 10, 20, 30, 40: Circuit unit
11, 31: First flow path member
21, 41: Second flow path member
12, 22, 32, 42: Coolant flow path
13, 23: Heat sink layer
14, 24: Semiconductor element
15a, 15b, 15c, 15d: Brazing material or solder
15e: Adhesive layer
16a, 16b, 16c, 16d, 16e: Wiring layer
19, 39: Cooling unit
25a, 25b, 25c, 25d: Brazing material or solder
26a, 26b, 26c, 26d: Wiring layer
51, 61, 71, 81: Connecting pipe
52, 62, 72, 82: Coolant flow path
92, 102: Coolant flow path
91, 101, 111: Pipe
100, 200, 201, 300, 400: Semiconductor device
112: Notch

The invention claimed is:

1. A semiconductor device, comprising at least one cooling unit, each of the at least one cooling unit comprising:
at least one circuit unit, each of the at least one circuit unit comprising a layer stack including:
a heat sink layer;
a plurality of wiring layers; and
a semiconductor element disposed between the heat sink layer and the plurality of wiring layers, wherein the semiconductor element is directly adhered to the heat sink layer and the plurality of wiring layers, and at least one of the plurality of wiring layers is electrically connected to a gate of the semiconductor element;
a first flow path member comprised of an insulating material; and
a second flow path member comprised of an insulating material, each of the at least one circuit unit being disposed between the first flow path member and the second flow path member,
the plurality of wiring layers of a respective at least one circuit unit being directly adhered to only one of the first flow path member and the second flow path member,
the heat sink layer of the respective at least one circuit unit being directly adhered to only the other one of the first flow path member and the second flow path member.

2. The semiconductor device according to claim 1, wherein
the at least one circuit unit comprises:
a first circuit unit; and
a second circuit unit adjacent to the first circuit unit,
where the heat sink layer of the first circuit unit is disposed towards the first flow path member, the plurality of wiring layers of the first circuit unit is disposed towards the second flow path member, the heat sink layer of the second circuit unit is disposed towards the second flow path member, and the plurality of wiring layers of the second circuit unit is disposed towards the first flow path member.

3. The semiconductor device according to claim 1, wherein
the at least one cooling unit comprises:
a first cooling unit; and
a second cooling unit disposed so that the first cooling unit and the second cooling unit are stacked vertically, and
the first flow path member or the second flow path member of the first cooling unit is shared by the first and second cooling units.

4. The semiconductor device according to claim 1, wherein the first flow path member and the second flow path member are connected by a connecting pipe.

5. The semiconductor device according to claim 1, wherein the first flow path member and the second flow path member are comprised of a silicon nitride ceramic material.

6. The semiconductor device according to claim 4, wherein the connecting pipe comprises a first end surface, a second end surface opposite the first end surface, an outer surface, and an inner surface, and
wherein the first flow path member is coupled to the first end surface of the connecting pipe and the second flow path member is coupled to the second end surface of the connecting pipe,
an adhesive layer is disposed between the first end surface of the connecting pipe and the first flow path member, or between the second end surface of the connecting pipe and the second flow path member, and a part of the adhesive layer is disposed to extend from the outer surface of the connecting pipe to the first flow path member, or to the second flow path member.

7. A method for producing a semiconductor device comprising:
providing at least one cooling unit, each of the at least one cooling unit comprising:
at least one circuit unit, each of the at least one circuit unit comprising a layer stack including:
a heat sink layer;
a plurality of wiring layers; and
a semiconductor element disposed between the heat sink layer and the plurality of wiring layers, wherein the semiconductor element is directly adhered to the heat sink layer and the plurality of wiring layers and wherein at least one of the plurality of wiring layers is electrically connected to a gate of the semiconductor element;
providing a first flow path member comprised of an insulating material; and
providing a second flow path member comprised of an insulating material, each of the at least one circuit unit being disposed between the first flow path member and the second flow path member,
the plurality of wiring layers of a respective at least one circuit unit is directly adhered to only one of the first flow path member and the second flow path member,
the heat sink layer of the respective at least one circuit unit is directly adhered to only the other one of the first flow path member and the second flow path member, and
wherein the first flow path member and the second flow path member are connected by a connecting pipe,
placing a brazing material or a solder between the semiconductor element and the plurality of wiring layers to form a first connection arrangement, and
placing an adhesive between the first flow path member and the connecting pipe to form a second connection arrangement, and between the second flow path member and the connecting pipe to form a third connection arrangement, and
heating the first connection arrangement, the second connection arrangement, and the third connection arrangement thereby joining the semiconductor element and at least one of the plurality of wiring layers, the first flow path member and the connecting pipe, and the second flow path member and the connecting pipe.

8. The method according to claim 7, wherein the first connection arrangement, the second connection arrangement, and the third connection arrangement are heated at the same time thereby simultaneously joining the semiconductor element and the plurality of wiring layers, the first flow path member and the connecting pipe, and the second flow path member and the connecting pipe.

9. The semiconductor device according to claim 1, wherein the plurality of wiring layers of each of the at least one circuit unit comprises a plurality of wirings configured to connect to external devices or signal terminals.

10. The semiconductor device according to claim 1, wherein the plurality of wiring layers of each respective at least one circuit unit is directly adhered to only one of the first flow path member and the second flow path member, and the heat sink layer of said each respective at least one circuit unit is directly adhered to only the other one of the first flow path member and the second flow path member.

11. The semiconductor device according to claim 9, wherein
the at least one circuit unit comprises:
a first circuit unit; and
a second circuit unit adjacent to the first circuit unit,
wherein the heat sink layer of the first circuit unit is only coupled to the first flow path member, the plurality of wirings of the first circuit unit is only coupled to the second flow path member, the heat sink layer of the second circuit unit is only coupled to the second flow path member, and the plurality of wirings of the second circuit unit is only coupled to the first flow path member.

12. The semiconductor device according to claim 2, wherein the first circuit unit and the second circuit unit are independent and separate layer stacks.

13. The semiconductor device according to claim 9, wherein the heat sink layer of the respective at least one circuit unit is an electrode.

14. A semiconductor device, comprising at least one cooling unit, each of the at least one cooling unit comprising:
at least one circuit unit, each of the at least one circuit unit comprising:
a heat sink layer;
a wiring layer; and
a semiconductor element disposed between the heat sink layer and the wiring layer;
a first flow path member comprised of an insulating material; and
a second flow path member comprised of an insulating material, each of the at least one circuit unit being disposed between the first flow path member and the second flow path member,
the wiring layer of a respective at least one circuit unit being directly adhered to only one of the first flow path member and the second flow path member,
the heat sink layer of the respective at least one circuit unit being directly adhered to only the other one of the first flow path member and the second flow path member,
wherein the at least one circuit unit comprises:
a first circuit unit; and
a second circuit unit adjacent to the first circuit unit,
wherein the heat sink layer of the first circuit unit is disposed towards the first flow path member, the wiring layer of the first circuit unit is disposed towards the second flow path member, the heat sink layer of the second circuit unit is disposed towards the second flow path member, and the wiring layer of the second circuit unit is disposed towards the first flow path member.

* * * * *